United States Patent
Levi et al.

(10) Patent No.: US 8,962,493 B2
(45) Date of Patent: Feb. 24, 2015

(54) MAGNETIC RANDOM ACCESS MEMORY CELLS HAVING IMPROVED SIZE AND SHAPE CHARACTERISTICS

(75) Inventors: Amitay Levi, Cupertino, CA (US); Dafna Beery, Palo Alto, CA (US)

(73) Assignee: Crocus Technology Inc., Santa Clara, CA (US)

( * ) Notice: Subject to any disclaimer, the term of this patent is extended or adjusted under 35 U.S.C. 154(b) by 679 days.

(21) Appl. No.: 12/966,865

(22) Filed: Dec. 13, 2010

(65) Prior Publication Data

US 2012/0146166 A1 Jun. 14, 2012

(51) Int. Cl.
| | |
|---|---|
| H01L 27/22 | (2006.01) |
| H01L 21/027 | (2006.01) |
| H01L 43/12 | (2006.01) |
| H01L 43/08 | (2006.01) |
| H01L 21/033 | (2006.01) |

(52) U.S. Cl.
CPC .............. *H01L 43/12* (2013.01); *H01L 27/222* (2013.01); *H01L 43/08* (2013.01)
USPC ..... 438/763; 438/761; 438/778; 257/E21.665

(58) Field of Classification Search
CPC ................ H01L 27/222–27/228; H01L 29/82; H01L 21/8246; H01L 43/12; H01L 43/08
USPC ................. 438/758–761, 763, 778, 787, 791; 257/E21.665
See application file for complete search history.

(56) References Cited

U.S. PATENT DOCUMENTS

| | | | |
|---|---|---|---|
| 6,350,695 B1 | 2/2002 | Tae et al. | |
| 6,806,096 B1 * | 10/2004 | Kim et al. | 438/3 |
| 7,737,685 B2 * | 6/2010 | Low et al. | 324/207.25 |
| 7,948,044 B2 * | 5/2011 | Horng et al. | 257/421 |
| 8,169,816 B2 * | 5/2012 | Min et al. | 365/158 |
| 8,178,405 B2 * | 5/2012 | Lai et al. | 438/244 |
| 2003/0199104 A1 * | 10/2003 | Leuschner et al. | 438/3 |
| 2004/0137749 A1 * | 7/2004 | Ying et al. | 438/710 |
| 2004/0264240 A1 * | 12/2004 | Hineman et al. | 365/158 |
| 2005/0079647 A1 * | 4/2005 | Abraham et al. | 438/48 |
| 2005/0277207 A1 * | 12/2005 | Costrini et al. | 438/3 |
| 2005/0280040 A1 * | 12/2005 | Kasko et al. | 257/213 |
| 2006/0186496 A1 * | 8/2006 | Ditizio | 257/421 |
| 2007/0172964 A1 * | 7/2007 | Yen et al. | 438/3 |
| 2008/0029754 A1 * | 2/2008 | Min et al. | 257/4 |
| 2008/0130354 A1 * | 6/2008 | Ho | 365/171 |
| 2008/0225577 A1 * | 9/2008 | Hosotani et al. | 365/158 |

(Continued)

FOREIGN PATENT DOCUMENTS

| | | |
|---|---|---|
| JP | 2009-010375 A | 1/2009 |
| KR | 10-2009-0059821 A | 6/2009 |

OTHER PUBLICATIONS

International Search Report and Written Opinion issued to International Patent Application No. PCT/US2011/064457, Jul. 24, 2012, 9 pgs.

*Primary Examiner* — Laura Menz
*Assistant Examiner* — Maliheh Malek
(74) *Attorney, Agent, or Firm* — Cooley LLP

(57) ABSTRACT

A manufacturing method to form a memory device includes: (1) forming a dielectric layer adjacent to a magnetic stack; (2) forming an opening in the dielectric layer; (3) applying a hard mask material adjacent to the dielectric layer to form a pillar disposed in the opening of the dielectric layer; and (4) using the pillar as a hard mask, patterning the magnetic stack to form a MRAM cell.

15 Claims, 6 Drawing Sheets

(56) References Cited

U.S. PATENT DOCUMENTS

| | | | |
|---|---|---|---|
| 2008/0280431 A1* | 11/2008 | Jung et al. | 438/593 |
| 2009/0001045 A1 | 1/2009 | Chen et al. | |
| 2009/0073737 A1* | 3/2009 | Klostermann et al. | 365/53 |
| 2009/0078927 A1* | 3/2009 | Xiao et al. | 257/9 |
| 2009/0091037 A1 | 4/2009 | Assefa et al. | |
| 2009/0148991 A1 | 6/2009 | Chung et al. | |
| 2009/0230379 A1* | 9/2009 | Klostermann et al. | 257/5 |
| 2009/0256220 A1* | 10/2009 | Horng et al. | 257/421 |
| 2009/0273022 A1 | 11/2009 | Radigan et al. | |
| 2010/0032642 A1* | 2/2010 | Park et al. | 257/4 |
| 2010/0109061 A1* | 5/2010 | Kushida | 257/295 |
| 2010/0109085 A1* | 5/2010 | Kim et al. | 257/364 |
| 2010/0117048 A1* | 5/2010 | Lung et al. | 257/4 |
| 2010/0181633 A1* | 7/2010 | Nam et al. | 257/421 |
| 2010/0240151 A1* | 9/2010 | Belen et al. | 438/3 |
| 2010/0284103 A1* | 11/2010 | Ibusuki et al. | 360/39 |
| 2010/0301480 A1* | 12/2010 | Choi et al. | 257/751 |
| 2011/0062536 A1* | 3/2011 | Min et al. | 257/421 |
| 2011/0141797 A1* | 6/2011 | Slonczewski | 365/158 |
| 2011/0147866 A1* | 6/2011 | Sun et al. | 257/421 |
| 2011/0189851 A1* | 8/2011 | Jeong et al. | 438/675 |
| 2011/0220985 A1* | 9/2011 | Son et al. | 257/321 |
| 2011/0272380 A1* | 11/2011 | Jeong et al. | 216/22 |
| 2012/0028373 A1* | 2/2012 | Belen et al. | 438/3 |
| 2012/0108031 A1* | 5/2012 | Lee et al. | 438/382 |
| 2012/0126353 A1* | 5/2012 | Nam et al. | 257/421 |
| 2012/0243308 A1* | 9/2012 | Saida et al. | 365/173 |
| 2012/0288964 A1* | 11/2012 | Gaidis et al. | 438/3 |
| 2012/0315707 A1* | 12/2012 | Nam | 438/3 |

* cited by examiner

MAGNETIC RANDOM ACCESS MEMORY CELLS HAVING IMPROVED SIZE AND SHAPE CHARACTERISTICS

FIELD OF THE INVENTION

The invention relates generally to memory devices. More particularly, the invention relates to memory devices including magnetic random access memory ("MRAM") cells having improved size and shape characteristics.

BACKGROUND

MRAM devices have become the subject of increasing interest, in view of the discovery of magnetic tunnel junctions having a strong magnetoresistance at ambient temperatures. MRAM devices offer a number of benefits, such as faster speed of writing and reading, non-volatility, and insensitivity to ionizing radiations. Consequently, MRAM devices are increasingly replacing memory devices that are based on a charge state of a capacitor, such as dynamic random access memory devices and flash memory devices.

In a conventional implementation, a MRAM device includes an array of MRAM cells, each one of which includes a magnetic tunnel junction formed of a pair of ferromagnetic layers separated by a thin insulating layer. One ferromagnetic layer, the so-called reference layer, is characterized by a magnetization with a fixed direction, and the other ferromagnetic layer, the so-called storage layer, is characterized by a magnetization with a direction that is varied upon writing Of the device, such as by applying a magnetic field. When the respective magnetizations of the reference layer and the storage layer are antiparallel, a resistance of the magnetic tunnel junction is high, namely having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which is derived from a reference cell or a group of reference cells and represents an inbetween resistance value between that of the high logic state "1" and the low logic state "0".

A MRAM device is conventionally manufactured by photolithography, in which a photoresist is used as a soft mask tier patterning a stack of magnetic layers. Specifically, a photoresist layer is formed on the stack of magnetic layers, and the photoresist layer is then patterned to form an array of dots. Portions of the stack of magnetic layers exposed by the array of dots are then etched away to form a corresponding array of MRAM cells. Subsequently, the photoresist layer is stripped to result in a MRAM device.

The above-described manufacturing method can suffer from certain deficiencies. Specifically, a size of a MRAM cell is typically governed by a resolution of photolithography, thereby presenting challenges in terms of scaling down to achieve higher densities of MRAM cells. Patterning a photoresist layer to form an array of dots with small sizes can be difficult to achieve, without the use of expensive and complex photolithographic equipment and techniques that can result in higher manufacturing costs. Moreover, shapes of resulting MRAM cells can be difficult to control, given the use of a photoresist as a soft mask. Specifically, an array of dots of the photoresist can be prone to striations or other shape imperfections, such as arising from conditions during development or exposure or arising from deformations introduced during etching, given a relatively high etch-rate of the photoresist. Such shape imperfections, in turn, can be imparted onto resulting MRAM cells, resulting in a variability of shapes in an array of the MRAM cells. This variability can impact a resistance of the MRAM cells across the array and can result in a distribution of the resistance values $R_{min}$ and $R_{max}$ for the array, thereby complicating a comparison between a measured resistance value of an individual cell and a reference resistance value $R_{ref}$ during reading.

It is against this background that a need arose to develop the memory devices and related manufacturing methods described herein.

SUMMARY

One aspect of the invention relates to a manufacturing method to form a memory device. In one embodiment, the manufacturing method includes: (1) forming a dielectric layer adjacent to a magnetic stack; (2) forming an opening in the dielectric layer; (3) applying a hard mask material adjacent to the dielectric layer to form a pillar disposed in the opening of the dielectric layer; and (4) using the pillar as a hard mask, patterning the magnetic stack to form a MRAM cell.

Another aspect of the invention relates to a memory device. In one embodiment, the memory device includes a MRAM cell and a pillar disposed on the MRAM cell. The pillar includes a hard metal, and a sidewall of the pillar is substantially aligned with a sidewall of the MRAM cell.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Definitions

The following definitions apply to some of the aspects described with respect to sonic embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining. Adjacent objects can be spaced apart from one another or can be in actual or direct contact with one another. In some instances, adjacent objects can be formed integrally with one another.

As used herein, the terms "connect," "connected," and "connection" refer to an operational coupling or linking. Connected objects can be directly coupled to one another or can be indirectly coupled to one another, such as via another set of objects.

As used herein, the term "main group element" refers to a chemical element in any of Group IA (or Group 1), Group IIA (or Group 2), Group IIIA (or Group 13), Group IVA (or Group 14), Group VA (or Group 15), Group VIA (or Group 16), Group VIIA (or Group 17), and Group VIIIA (or Group 18). A main group element is also sometimes referred to as a s-block element or a p-block element.

As used herein, the term "transition metal" refers to a chemical element in any of Group IVB (or Group 4), Group VB (or Group 5), Group VIB (or Group 6), Group VIM (or Group 7), Group VIIIB (or Groups 8, 9, and 10). Group IB (or Group 11), and Group IIB (or Group 12). A transition metal is also sometimes referred to as a d-block element.

As used herein, the term "rare earth element" refers to any of Sc, Y, La, Ce, Pr, Nd, Pm, Sm, Eu, Gd, Tb, Dy, Ho, Er, Tm, Yb, and Lu.

MRAM Devices

Figure 1A:
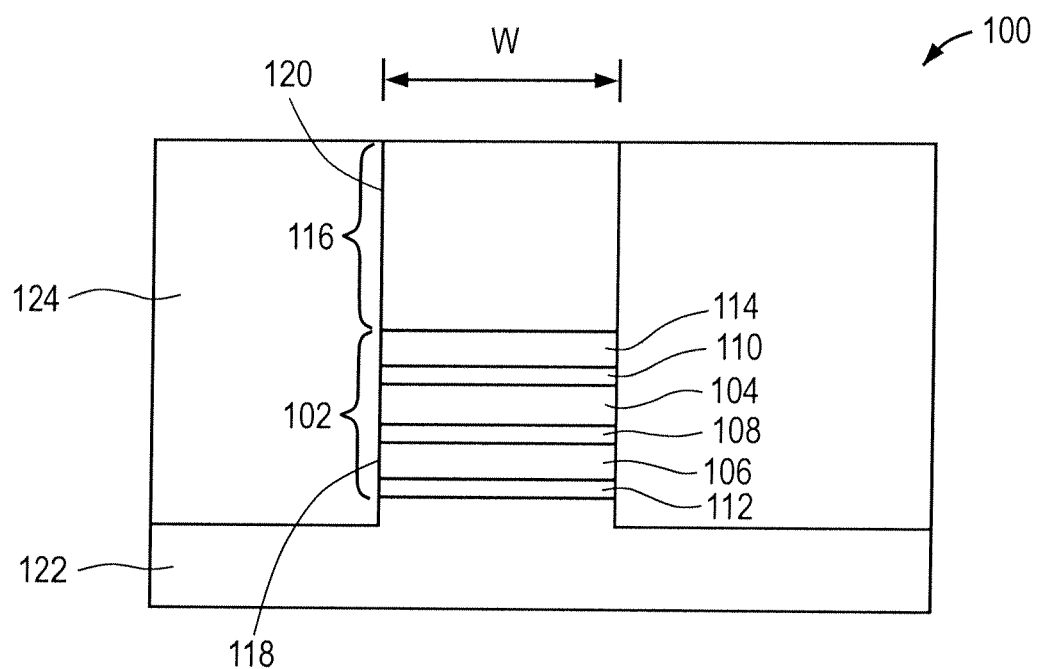
FIG. 1A and FIG. 1B illustrate a memory device implemented in accordance with am embodiment of the invention.
Figure 1B:
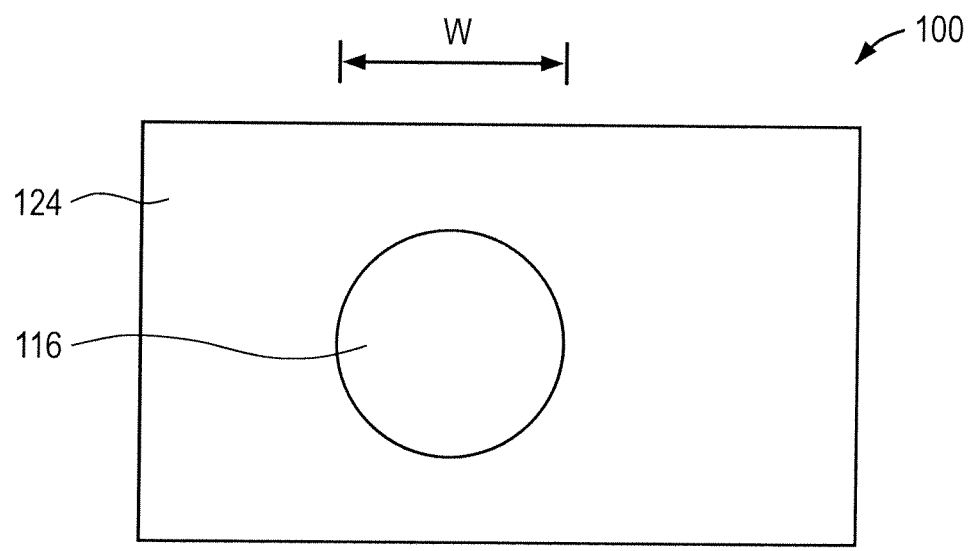

Attention first turns to FIG. 1A and FIG. 1B, which illustrate a memory device 100 implemented in accordance with an embodiment of the invention. Specifically, FIG. 1A is a cross-sectional view of the memory device 100, and FIG. 1B is a top view of the memory device 100. In the illustrated embodiment, the memory device 100 is a MRAM device that includes a MRAM cell 102, which extends upwardly from a substrate 122. For ease of presentation and to motivate certain advantages and functionalities of the memory device 100, the single MRAM cell 102 is illustrated in FIG. 1A and FIG. 1B, although it is contemplated that multiple MRAM cells can be included, such as in the form of an array.

The MRAM cell 102 is implemented as a magnetic tunnel junction, and includes a storage layer 104, a reference layer 106, and an insulating layer 108 that is disposed between the storage layer 104 and the reference layer 106. Each of the storage layer 104 and the reference layer 106 includes, or is formed of, a magnetic material and, in particular, a magnetic material of the ferromagnetic type. In general, the storage layer 104 and the reference layer 106 can include the same ferromagnetic material or different ferromagnetic materials. Examples of suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or $Ni_{80}Fe_{20}$); alloys based on Ni, Fe, and boron ("B"); $Co_{90}Fe_{10}$; and alloys based on Co, Fe, and B. A thickness of each of the storage layer 104 and the reference layer 106 can be in the nanometer ("nm") range, such as from about 1 nm to about 20 nm or from about 1 nm to about 10 nm. The insulating layer 108 functions as a tunnel barrier, and includes, or is formed of, an insulating material. Examples of suitable insulating materials include oxides, such as aluminum oxide (e.g., $Al_2O_3$) and magnesium oxide (e.g., MgO). A thickness of the insulating layer 108 can be in the run range, such as from about 1 nm to about 10 nm.

Referring to FIG. 1A, the MRAM cell 102 also includes a pinning layer 112, which is adjacent to the reference layer 106 and, through exchange bias, stabilizes a magnetization of the reference layer 106 along a particular direction when a temperature within, or in the vicinity of, the pinning layer 112 is lower than a blocking temperature $T_{BR}$, or another threshold temperature such as a Neel temperature. In the illustrated embodiment, the MRAM cell 102 is implemented for thermally assisted switching ("TAS"), and the storage layer 104 also is exchange biased by another pinning layer 110, which is adjacent to the storage layer 104 and is characterized by a blocking temperature $T_{BR}$, or another threshold temperature, which is smaller than the blocking temperature $T_{BR}$. Below the blocking temperature $T_{BS}$, a magnetization of the storage layer 110 is stabilized by the exchange bias, thereby retaining a stored logic state in accordance with a direction of that magnetization. Writing is carried out by heating the MRAM cell 102 above the blocking temperature $T_{BS}$ (but below $T_{BR}$), thereby unpinning the magnetization of the storage layer 110 to allow writing, such as by applying a magnetic field. The MRAM cell 102 is then cooled to below the blocking temperature $T_{BS}$ with the magnetic field applied, such that the magnetization of the storage layer 110 is retained in its written direction.

Each of the pinning layers 110 and 112 includes, or is formed of, a magnetic material and, in particular, a magnetic material of the antiferromagnetic type. Examples of suitable antiferromagnetic materials include transition metals and their alloys. For example, suitable antiferromagnetic materials include alloys based on manganese ("Mn"), such as alloys based on iridium ("Ir") and Mn (e.g., IrMn), alloys bused on Fe and Mn (e.g., FeMn); alloys based on platinum ("Pt") and Mn (e.g., PtMn); and alloys based on Ni and Mn (e.g., NiMn). For certain implementations, the pinning layer 110 can include an alloy based on Ir and Mn (or based on Fe and Mn) with a blocking temperature $T_{BS}$ in the range of about 120° C. to about 220° C. or about 150° C. to about 200° C., and the pinning layer 112 can include an alloy based on Pt and Mn (or based on Ni and Mn) with a blocking temperature $T_{BR}$ in the range of about 300° C. to about 350° C.

Still referring to FIG. 1A, the MRAM cell 102 further includes a cap layer 114, which is adjacent to the pinning layer 110 and forms an upper portion of the MRAM cell 102. The cap layer 114 provides electrical connectivity, as well as either, or both, thermal insulation and a protective function for underlying layers during manufacturing of the MRAM cell 102, and includes, or is formed of, an electrically conductive material. Examples of suitable electrically conductive materials include metals, such as copper, aluminum, and platinum; and alloys, such as CoSiN. A thickness of the cap layer 114 can be in the nm range, such as from about 1 nm to about 70 nm.

Other implementations of the MRAM cell 102 are contemplated. For example, the relative positioning of the storage layer 104 and the reference layer 106 can be reversed, with the reference layer 106 disposed above the storage layer 104. As another example, either, or both, of the storage layer 104 and the reference layer 106 can include multiple sub-layers in a fashion similar to that of the so-called synthetic antiferromagnetic layer. As further examples, either, or both, of the pinning layers 110 and 112 can be omitted, and the cap layer 114 also can be omitted.

Referring to FIG. 1A and FIG. 1B, the memory device 100 also includes a pillar 116, which is disposed on the MRAM cell 102 and adjacent to the cap layer 114. A dielectric layer 124 is disposed on the substrate 122, and at least partially covers or encapsulates the MRAM cell 102 and the pillar 116. As further explained below, the pillar 116 corresponds to, or is derived from, a hard mask that is used to form the MRAM cell 102. The use of such a hard mask allows the MRAM cell 102 to be formed with improved size and shape characteristics. Specifically, a size of the pillar 116 can be readily scaled down, with reduced dependence upon a resolution of photolithography, and without requiring the use of expensive and complex photolithographic equipment and techniques. Moreover, a shape of the pillar 116 can be controlled so as to have a well-defined contour, with a substantial absence of striations or other shape imperfections. Through its use as a hard mask, such desirable size and shape characteristics of the pillar 116 can be imparted onto the MRAM cell 102.

As illustrated in FIG. 1A and FIG. 1B, lateral extents of the MRAM cell 102 and the pillar 116, as represented by W, are substantially the same, and are readily scaled down to below about 0.25 µm. For certain implementations, W can be scaled down to sub-lithographic sizes below a typical resolution of photolithography, such as no greater than about 0.2 µm, no greater than about 0.15 µm, no greater than about 0.13 µm, or no greater than about 0.12 µm, and down to about 0.05 µm or less. Such scaling down of W allows a higher density of the MRAM cell 102 and other MRAM cells in the memory device 100, as well as a reduced power consumption during TAS operations. Also, contours of the MRAM cell 102 and the pillar 116, as viewed from the top, are both well-defined, and are substantially the same, with a circumferential sidewall 118 of the MRAM cell 102 substantially aligned or co-planar with a circumferential sidewall 120 of the pillar 116. Such well-defined contours, in turn, provide a greater uniformity in resistance and other characteristics across the MRAM cell 102 and other MRAM cells in the memory device 100. In the illustrated embodiment, the contours of the MRAM cell 102 and the pillar 116 are both substantially circular, with W corresponding to a diameter. However, it is contemplated that the contours of the MRAM cell 102 and the pillar 116 can be formed with other shapes, such as elliptical, square-shaped, rectangular, and other polygonal or non-polygonal shapes. In the case of a non-circular shape, W can correspond to, for example, a largest lateral extent of the non-circular shape, such as a major axis in the case of an elliptical shape. A thickness of the pillar 116 can be comparable to an overall thickness of the MRAM cell 102, such as from about 50 nm to about 400 nm or from about 100 nm to about 350 nm.

The pillar 116 includes, or is formed of, a hard mask material. A hard mask material can be characterized by a relatively high resistance towards deformation or etching, such as in accordance with a Vickers hardness or another measure of hardness or etch selectivity. Examples of suitable hard mask materials include hard metals, such as tungsten, molybdenum, and titanium; alloys of hard metals, either with or without main group elements, such as alloys of tungsten and titanium; and other patternable materials having a measure of hardness or etch selectivity that is comparable, or superior, to that of tungsten, molybdenum, or titanium, such as one having a Vickers hardness that is at least about 950 Megapascal ("MPa"), at least about 1,500 MPa, or at least about 3,400 MPa. A hard metal is typically electrically conductive, and, by leveraging the electrical conductivity of tungsten or another hard metal, the pillar 116 can serve a further function of an electrical interconnect, thereby obviating operations to form a set of vias on the MRAM cell 102. However, it is contemplated that the pillar 116 can be used in conjunction with a set of vias to establish a desired electrical connection to the MRAM cell 102.

Manufacturing Methods of MRAM Devices

Figure 2A:
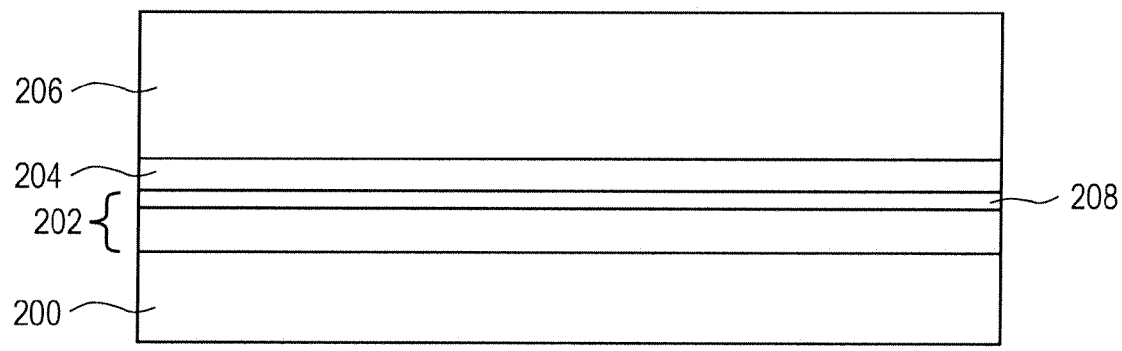
FIG. 2A through FIG. 2J illustrate a manufacturing method to form a memory device, according to an embodiment of the invention.

FIG. 2A through FIG. 2J illustrate a sequence of cross-sectional views of a manufacturing method to form a memory device, according to an embodiment of the invention. Referring first to FIG. 2A, a substrate 200 is provided, on which a magnetic stack 202 is disposed. Although not illustrated in FIG. 2A, the substrate 200 can include a set of dielectric layers and a set of semiconductor devices, such as transistors, which can be electrically connected to the magnetic stack 202 through traces, vias, or other electrical interconnect. The magnetic stack 202 includes a set of layers that form a magnetic tunnel junction, as well as an upper, cap layer 208. Various layers of the magnetic stack 202 can be formed on the substrate 200 by a suitable deposition technique, such as chemical vapor deposition ("CVD"), plasma enhanced chemical vapor deposition ("PECVD"), vacuum deposition, or a combination of such techniques. Other implementations of the magnetic stack 202 are contemplated, such as one in which the cap layer 208 is omitted.

Still referring to FIG. 2A, a set of dielectric layers are formed on the magnetic stack 202 by a suitable coating or deposition technique, such as spin-on coating, CVD, PECVD, vacuum deposition, or a combination of such techniques. Specifically, a dielectric layer 204 is formed on the cap layer 208, and then another dielectric layer 206 is formed on the dielectric layer 204. In general, the dielectric layers 204 and 206 can include the same dielectric material or different dielectric materials. Examples of suitable dielectric materials include silicon oxide (e.g., tetraethyl orthosilicate ("TEOS")), silicon nitride, silicon oxynitride, and silicon carbide. As illustrated in FIG. 2A, the dielectric layers 204 and 206 include different dielectric materials, such as silicon nitride and TEOS, respectively, which have different resistance towards etching or different etch-rates. In such manner, the dielectric layer 206 can be preferentially etched in a subsequent operation, while the dielectric layer 204 can remain to protect underlying layers. It is also contemplated that the dielectric layer 204 can be omitted.

Figure 2B:
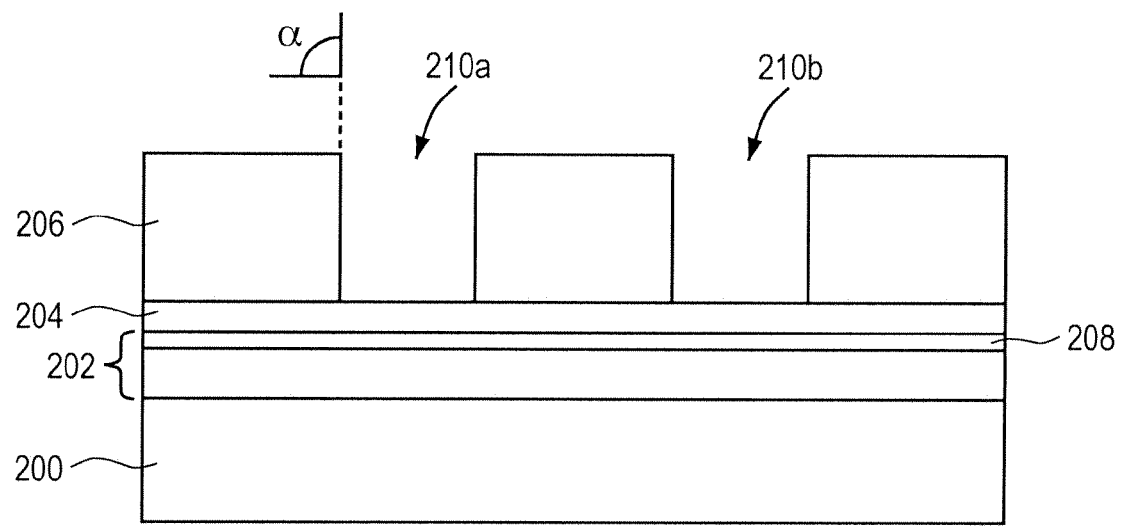

Referring next to FIG. 2B, a set of openings 210a and 210b are formed in the dielectric layer 206 by photolithography, or another suitable patterning technique. Specifically, a photoresist layer is formed on the dielectric layer 206, and a set of openings are formed in the photoresist layer at locations under which a set of MRAM cells are to be formed. Portions of the dielectric layer 206 exposed by the openings in the photoresist layer are then etched away to form the corresponding openings 210a and 210b in the dielectric layer 206. Subsequently, the photoresist layer is stripped to result in a configuration as illustrated in FIG. 2B. Although the two openings 210a and 210b are illustrated in FIG. 2B, it is contemplated that more or less openings can be formed.

Advantageously, an array of openings having desired sizes and shapes can be more readily formed by photolithography, as compared to an array of dots. Specifically, the openings 210a and 210b can be formed with small lateral extents and well-defined contours, with a substantial absence of striations or other shape imperfections. For example, the openings 210a and 210b can have lateral extents that are less than about 0.25 µm and substantially circular contours when viewed from the top. Such control over size and shape characteristics of the openings 210a and 210b, in turn, allows control over size and shape characteristics of resulting MRAM cells. In the illustrated embodiment, desirable size and shape characteristics of the openings 210a and 210b can be achieved without requiring the use of expensive and complex photolithographic equipment and techniques, such as by forming a thicker, more etch-resistant photoresist layer using a 248 nm photoresist, instead of a 193 nm photoresist, and defining small, circular openings in the photoresist layer by overexposure. Alternatively, complex photolithographic equipment and techniques can be used to yield further improvements in size and shape characteristics.

As illustrated in FIG. 2B, the openings 210a and 210b extend through the dielectric layer 206 to partially expose the dielectric layer 204 at locations corresponding to those of resulting MRAM cells. Because of different etch-rates of the dielectric layers 204 and 206, the dielectric layer 206 is preferentially etched such that the openings 210a and 210b terminate substantially at a boundary between the dielectric layers 204 and 206. Referring to FIG. 2B, sidewalls of the openings 210a and 210b form an angle $\alpha$ with respect to a horizontal plane, with the sidewalls being substantially vertical, and with the angle $\alpha$ at or close to 90°, such as in the range of about 80° to about 90°, about 85° to about 90°, or about 87° to about 90°. Such vertical orientation of the sidewalls of the openings 210a and 210b facilitates patterning of the magnetic stack 202, using a hard mask that is formed in the openings 210a and 210b as further explained below.

Figure 2C:
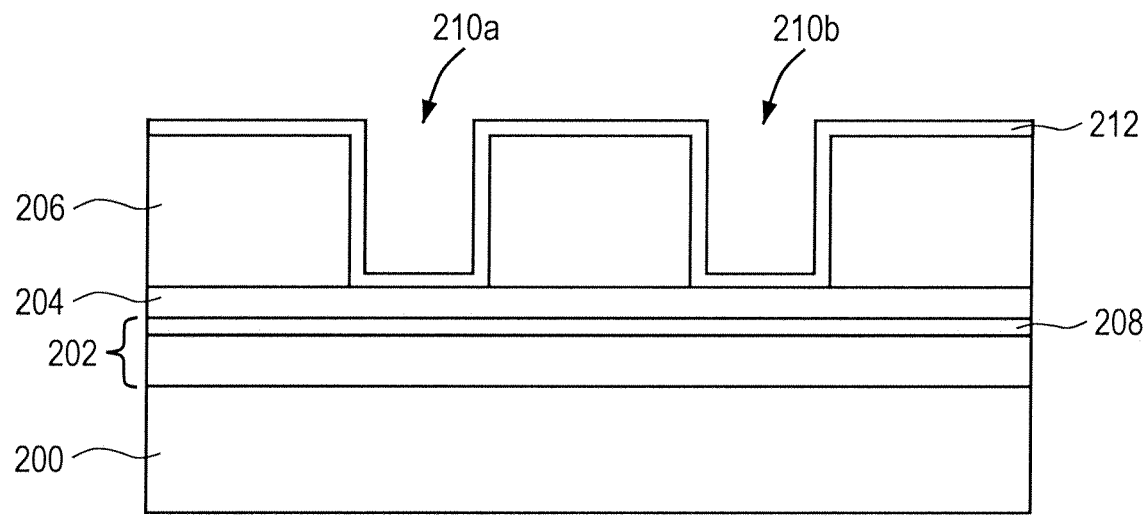
Figure 2D:
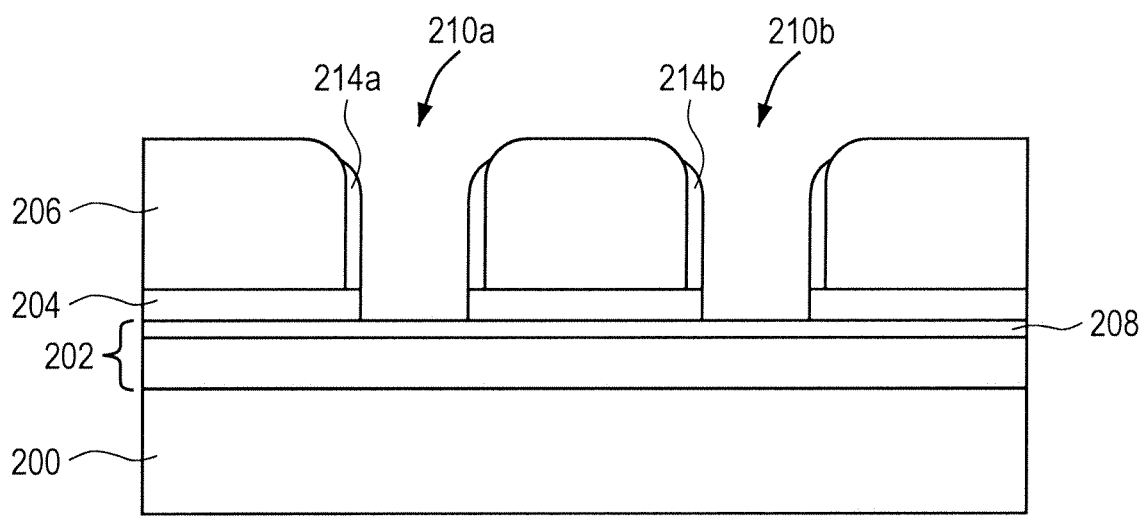

To allow the formation of MRAM cells with even smaller lateral extents, such as in the sub-lithographic range, spacers can be formed in the openings 210a and 210b to reduce their lateral extents resulting from photolithography. As illustrated in FIG. 2C, a liner layer 212 is formed on the dielectric layer 206, with the liner layer 212 extending into the openings 210a and 210b and partially filling the openings 210a and 210b along their sidewalls. The liner layer 212 includes TEOS or another suitable dielectric material, and is formed by a suitable coating or deposition technique, such as CVD, MCVD, vacuum deposition, a combination of such techniques, or any other conformal deposition technique. Next, portions of the liner layer 212 and the dielectric layers 204 and 206 are removed by etching, resulting in a configuration as illustrated in FIG. 2D. Specifically, portions of the liner layer 212 disposed on top of the dielectric layer 206 and at the bottom of the openings 210a and 210b are etched away, resulting in spacers 214a and 214b that are disposed along the sidewalls of the openings 210a and 210b. In the illustrated embodiment, portions of the dielectric layer 204 disposed at the bottom of the openings 210a and 210b are also etched away. In such manner, the openings 210a and 210b extend through the dielectric layers 204 and 206 to partially expose the cap layer 208 at locations corresponding to those of resulting MRAM cells, and the openings 210a and 210b also have reduced lateral extents because of the presence of the spacers 214a and 214b. As illustrated in FIG. 2D, etching may also remove portions of the dielectric layer 206, resulting in some curving or rounding of the sidewalls near the top of the openings 210a and 210b.

Figure 2E:
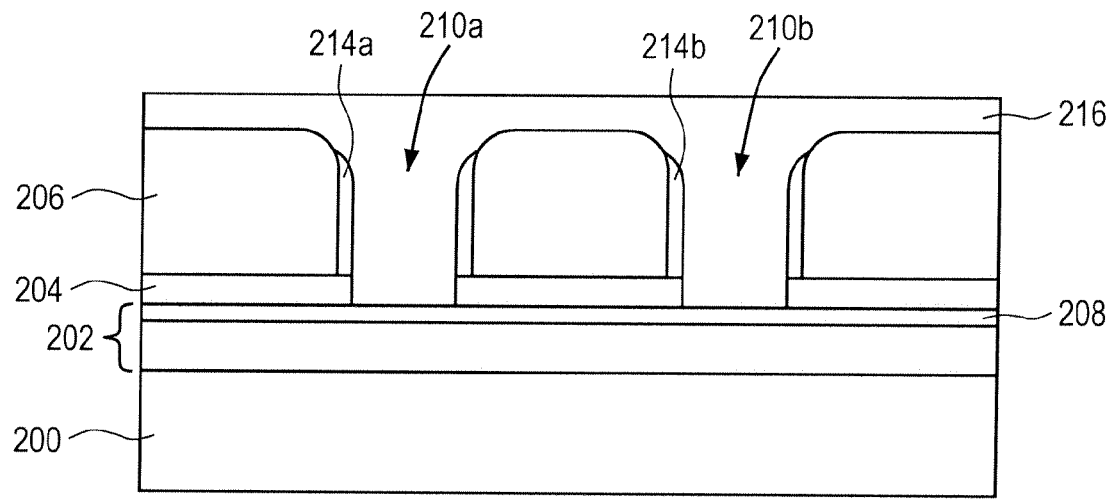

Turning next to FIG. 2E, a hard mask layer 216 is formed on the dielectric layer 206, with the hard mask layer 216 extending into the openings 210a and 210b and substantially filling, or plugging, the openings 210a and 210b, as circumferentially bounded by the spacers 214a and 214b. The hard mask layer 216 includes a hard mask material, such as tungsten or another hard metal, and is formed by applying the hard mask material using a suitable deposition technique, such as CVD, PECVD, vacuum deposition, a combination of such techniques, or any other conformal deposition technique. As further explained below, portions of the hard mask layer 216 disposed in the openings 210a and 210b serve as a hard mask for patterning the magnetic stack 202. Advantageously, such a hard mask can have a greater resistance towards etching or a lower etch-rate, as compared to a photoresist or another dielectric material conventionally used for patterning the magnetic stack 202. As a result, a shape integrity of the hard mask can be substantially preserved through etching, and resulting MRAM cells can be formed with well-defined contours, with a substantial absence of striations or other shape imperfections.

Figure 2F:
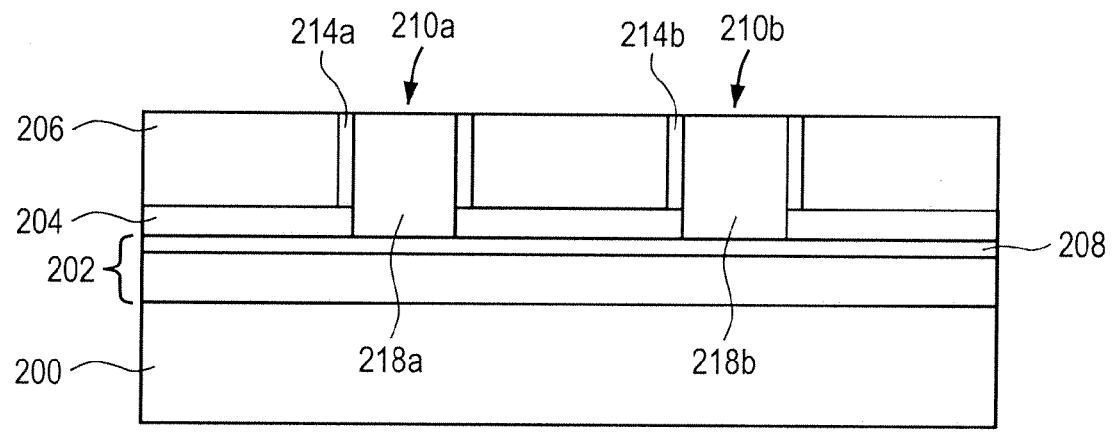

Next, portions of the hard mask layer 216 and the dielectric layer 206 are removed by chemical mechanical polishing ("CMP") or another suitable abrasive or leveling technique, resulting in a configuration as illustrated in FIG. 2F. Specifically, CMP is carried out to expose the top of the openings 210a and 210b, and remaining portions of the hard mask layer 216 correspond to pillars 218a and 218b, which are disposed in the openings 210a and 210b, and which serve as a hard mask for patterning the underlying magnetic stack 202. As illustrated in FIG. 2F, CMP also removes the curved or rounded portions of the sidewalk near the top of the openings 210a and 210b. In such manner, the resulting pillars 218a and 218b have sidewalls that are substantially vertical to facilitate patterning of the magnetic stack 202.

Figure 2G:
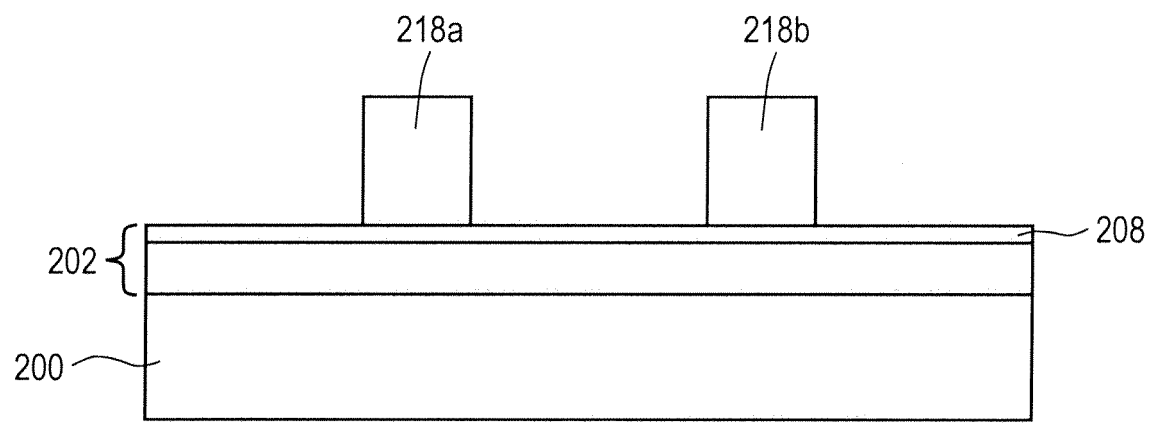
Figure 2H:
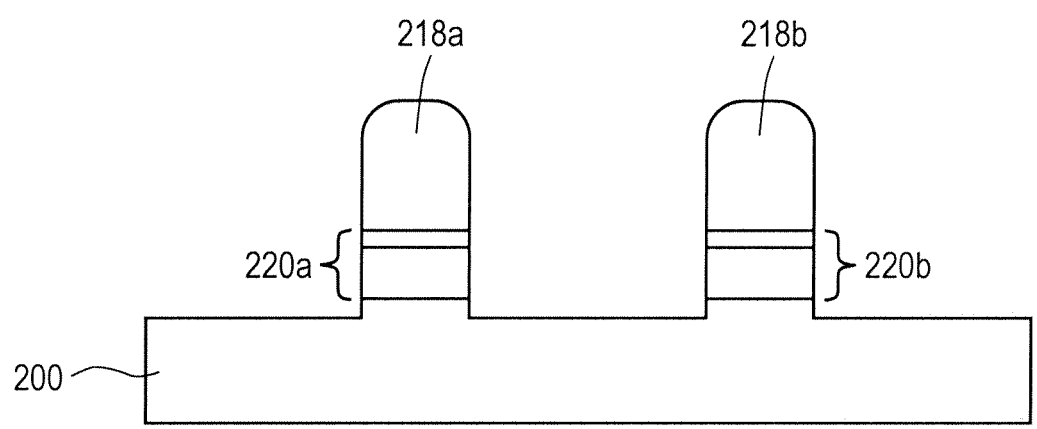

The dielectric layers 204 and 206 and the spacers 214a and 214b are next removed by selective etching, resulting in a configuration as illustrated in FIG. 2G. Because of their greater etch-rates, the dielectric layers 204 and 206 and the spacers 214a and 214b are preferentially etched away, with the pillars 218a and 218b remaining on the cap layer 208 at locations under which MRAM cells are to be formed. The magnetic stack 202 is then patterned, using the pillars 218a and 218b as a hard mask. Specifically, portions of the magnetic stack 202 exposed by the pillars 218a and 218b are removed by ion beam etching ("IBE") or another suitable etching technique such as reactive ion etching ("RIE"), while portions of the magnetic stack 202 under the pillars 218a and 218b are protected, thereby forming MRAM cells 220a and 220b as illustrated in FIG. 2H. Because of its high resistance towards etching or its low etch-rate, a shape integrity of the pillars 218a and 218b can be substantially preserved through IBE or RIE, thereby imparting desirable size and shape characteristics onto the MRAM cells 220a and 220b. As illustrated in FIG. 2H, IBE or RIE may produce some curving or rounding near the top of the pillars 218a and 218b. In some implementations, a strap layer can be formed at this stage.

Figure 2I:
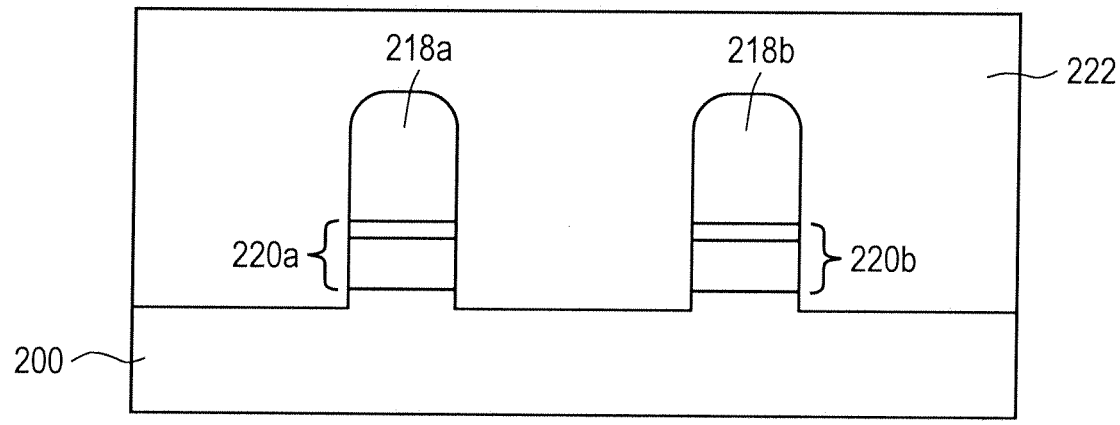
Figure 2J:
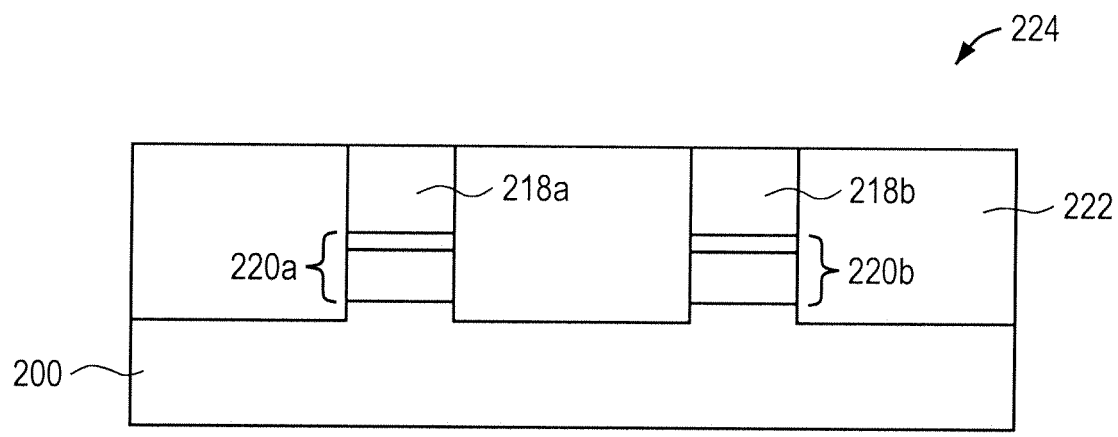

Turning next to FIG. 2I, a dielectric layer 222 is formed on the substrate 200 so as to cover or encapsulate the pillars 218a and 218b and the MRAM cells 220a and 220b. The dielectric layer 222 includes TEOS or another suitable dielectric material or a combination of different dielectric layers, and is formed by a suitable coating or deposition technique, such as CVD, PECVD, vacuum deposition, a combination of such techniques, or any other conformal deposition technique. Next, portions of the dielectric layer 222 and the pillars 218a and 218b are removed by CMP or another suitable abrasive or leveling technique, resulting in a configuration as illustrated in FIG. 2J. Specifically, CMP is carried out to expose the top of the pillars 218a and 218b, using the pillars 218a and 218b as a stop layer. Thus, by leveraging the hardness of tungsten or another hard metal, the pillars 218a and 218b can serve dual functions of a hard mask during etching and a stop layer during CMP. As illustrated in FIG. 2J, CMP also removes the curved or rounded top portions of the pillars 218a and 218b, resulting in substantially planar surfaces at the top of the pillars 218a and 218b. In such mariner, a memory device 224 is formed. Because the pillars 218a and 218b are formed of an electrically conductive material, the pillars 218a and 218b can establish electrical connections between the MRAM cells 220a and 220b and traces or semiconductor devices, which can be formed on top of the pillars 218a and 218b and the dielectric layer 222. Thus, by leveraging the electrical conductivity of tungsten or another hard metal, the pillars 218a and 218b can further serve as electrical interconnects, thereby obviating operations to form a set of vias on top of the MRAM cells 220a. and 220b. However, it is contemplated that the pillars 218a and 218b can be used in conjunction with a set of vias to establish desired electrical connections to the MRAM cells 220a and 220b. For example, CMP can stop at a certain distance above the pillars 218a and 218b, such as from about 100 nm to about 400 nm above the pillars 218a and 218b, and a via can be formed through the dielectric layer 222 to reach the top of the pillars 218a and 218b. This via can be used to connect the IMAM cells 220a and 220b to a metal layer formed above the dielectric layer 222.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A manufacturing method to form a memory device, comprising:
    forming a dielectric layer adjacent to a magnetic stack;
    forming an opening in the dielectric layer;
    forming a first layer adjacent to a sidewall of the opening to reduce a lateral extent of the opening;
    applying a hard mask material adjacent to the first layer to form a pillar disposed in the opening of the dielectric layer, wherein the hard mask material is electrically conductive, and the pillar having a lateral boundary that circumscribes the pillar;
    removing the first layer to expose the lateral boundary of the pillar; and
    using the pillar as a hard mask, and subsequent to removing the first layer, patterning the magnetic stack to form a magnetic random access memory (MRAM) cell such that the lateral boundary of the pillar is substantially aligned with a full extent of a lateral boundary of the MRAM cell that circumscribes the MRAM cell.

2. The manufacturing method of claim 1, wherein forming the opening in the dielectric layer is carried out such that the opening extends through the dielectric layer.

3. The manufacturing method of claim 1, wherein:
    the first layer includes a spacer; and
    forming the spacer is carried out such that the spacer partially fills the opening to reduce the lateral extent of the opening.

4. The manufacturing method of claim 1, wherein the first layer includes a spacer, and wherein forming the spacer includes:
    forming a liner layer adjacent to the dielectric layer and extending into the opening; and
    removing a portion of the liner layer, with the spacer remaining and disposed adjacent to the sidewall of the opening.

5. The manufacturing method of claim 1, wherein the hard mask material is electrically conductive.

6. The manufacturing method of claim 1, wherein the hard mask material is selected from hard metals and alloys of hard metals.

7. The manufacturing method of claim 6, wherein the hard mask material includes at least one of tungsten, molybdenum, and titanium.

8. The manufacturing method of claim 1, wherein applying the hard mask material is carried out such that the pillar substantially fills the opening.

9. The manufacturing method of claim 1, wherein applying the hard mask material includes:
    forming a layer of the hard mask material adjacent to the dielectric layer and extending into the opening; and
    removing a portion of the layer of the hard mask material, with the pillar remaining and disposed in the opening.

10. The manufacturing method of claim 9, wherein removing the portion of the layer of the hard mask material is carried out by chemical mechanical polishing.

11. The manufacturing method of claim 1, wherein patterning the magnetic stack is carried out by at least one of ion beam etching and reactive ion etching.

12. The manufacturing method of claim 1, further comprising removing the dielectric layer, with the pillar remaining and disposed adjacent to the magnetic stack, and wherein patterning the magnetic stack is carried out subsequent to removing the dielectric layer.

13. The manufacturing method of claim 12, wherein the dielectric layer is a first dielectric layer, and further comprising:
    subsequent to patterning the magnetic stack, forming a second dielectric layer covering the pillar and the MRAM cell; and
    removing a portion of the second dielectric layer.

14. The manufacturing method of claim 13, wherein removing the portion of the second dielectric layer is carried out by a leveling technique, using the pillar as a stop layer.

15. The manufacturing method of claim 1, wherein a first lateral dimension defined by the lateral boundary of the pillar is substantially the same as a second lateral dimension defined by the lateral boundary of the MRAM cell.

* * * * *